United States Patent
Zhao

(10) Patent No.: US 10,497,807 B2
(45) Date of Patent: Dec. 3, 2019

(54) PMOS TRANSISTOR AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Meng Zhao, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 15/397,081

(22) Filed: Jan. 3, 2017

(65) Prior Publication Data

US 2017/0200826 A1     Jul. 13, 2017

(30) Foreign Application Priority Data

Jan. 11, 2016   (CN) .......................... 2016 1 0016236

(51) Int. Cl.
*H01L 29/78*     (2006.01)
*H01L 21/225*    (2006.01)
(Continued)

(52) U.S. Cl.
CPC ...... *H01L 29/7848* (2013.01); *H01L 21/2253* (2013.01); *H01L 21/26506* (2013.01);
(Continued)

(58) Field of Classification Search
None
See application file for complete search history.

(56) References Cited

U.S. PATENT DOCUMENTS

2002/0047163 A1* 4/2002 Sayama ............ H01L 29/41766
257/368
2004/0038537 A1* 2/2004 Liu .................... H01L 21/0332
438/694

(Continued)

OTHER PUBLICATIONS

Definition of "coincide" from online Merriam-Webster Dictionary, available at URL: https://www.merriam-webster.com/dictionary/coincide.*

(Continued)

*Primary Examiner* — Erik Kielin
(74) *Attorney, Agent, or Firm* — Anova Law Group, PLLC

(57) ABSTRACT

The present disclosure provides PMOS transistors and fabrication methods thereof. An exemplary fabrication process of a PMOS transistor includes providing a semiconductor substrate having a surface; forming a gate structure on the surface of the semiconductor substrate; forming SiGe regions in the surface of the semiconductor substrate at two sides of the gate structure by implanting Ge ions into the semiconductor substrate; forming sidewalls on side surfaces of the gate structure and portions of surfaces of the SiGe regions close to the gate structure; removing portions of the SiGe regions at two sides of the gate structure to expose portions of the semiconductor substrate; forming trenches in the semiconductor substrate by etching the exposed portions of the semiconductor substrate at the two sides of the sidewalls; and forming source/drain regions by filling the trenches with a compressive stress material.

12 Claims, 3 Drawing Sheets

(51) Int. Cl.
*H01L 21/265* (2006.01)
*H01L 21/306* (2006.01)
*H01L 21/3065* (2006.01)
*H01L 21/324* (2006.01)
*H01L 29/06* (2006.01)
*H01L 29/08* (2006.01)
*H01L 29/165* (2006.01)
*H01L 29/167* (2006.01)
*H01L 29/66* (2006.01)

(52) U.S. Cl.
CPC .. *H01L 21/26513* (2013.01); *H01L 21/26586* (2013.01); *H01L 21/3065* (2013.01); *H01L 21/30604* (2013.01); *H01L 21/324* (2013.01); *H01L 29/0649* (2013.01); *H01L 29/0847* (2013.01); *H01L 29/165* (2013.01); *H01L 29/167* (2013.01); *H01L 29/6659* (2013.01); *H01L 29/66636* (2013.01)

(56) References Cited

U.S. PATENT DOCUMENTS

| | | |
|---|---|---|
| 2006/0234455 A1 | 10/2006 | Chen |
| 2007/0114604 A1* | 5/2007 | Huang ............... H01L 29/6656 257/335 |
| 2007/0120195 A1* | 5/2007 | Sheraw ............... H01L 27/0629 257/369 |
| 2008/0142885 A1 | 6/2008 | Mineji |
| 2010/0075476 A1* | 3/2010 | Miyashita ....... H01L 21/823807 438/229 |
| 2012/0097977 A1* | 4/2012 | Yamaguchi ....... H01L 21/30608 257/77 |
| 2013/0001698 A1 | 1/2013 | Waite et al. |
| 2013/0017660 A1 | 1/2013 | Fang et al. |
| 2014/0048886 A1 | 2/2014 | Chuang |
| 2014/0346565 A1 | 11/2014 | Wei et al. |
| 2015/0123147 A1 | 5/2015 | He |
| 2017/0047439 A1* | 2/2017 | Chen ................ H01L 29/66795 |

OTHER PUBLICATIONS

Wang, Grace Huiqi, et al., Performance Enhancement Schemes Featuring Lattice Mismatched S/D Stressors Concurrently Realized on CMOS Platform: e-SiGeSn S/D for pFETs by Sn+ Implant and SiC S/D for nFETs by C+ Implant, 2008 Symposium on VLSI Technology Digest of Technical Papers, IEEE, Jun. 17, 2008, pp. 207-208.

* cited by examiner

PMOS TRANSISTOR AND FABRICATION METHOD THEREOF

CROSS-REFERENCES TO RELATED APPLICATIONS

This application claims the priority of Chinese patent application No. 201610016236.3, filed on Jan. 11, 2016, the entirety of which is incorporated herein by reference.

FIELD OF THE INVENTION

The present invention generally relates to the field of semiconductor manufacturing and, more particularly, relates to PMOS transistors and fabrication processes thereof.

BACKGROUND

With the rapid development of semiconductor manufacturing technology, to achieve higher computing speed, larger data storage capacity and more functions, semiconductor devices have been developed toward higher device density and higher integration level. Thus, the gate of the complementary metal oxide semiconductor (CMOS) transistors has become shorter and shorter. Controlling the carrier mobility of the channel region is often used to improve the performance of the semiconductor devices. One common approach to control the carrier mobility is to control the stress in the channel region of a transistor so as to increase the drive current.

Currently, the embedded SiGe technique is often used to increase the stress in the channel region of a transistor. Specifically, SiGe material is formed in the regions for forming source/drain regions, and then a doping process is performed to form the source/drain regions. The SiGe material is used to generate a crystal lattice mismatch between silicon and the SiGe material to generate a compressive stress. The compressive stress is used to control the carrier mobility to improve the performance of the PMOS transistor.

The existing fabrication process of a PMOS transistor having SiGe source/drain regions includes providing a semiconductor substrate; forming a gate structure having a gate dielectric layer and a gate electrode on the gate dielectric layer on the semiconductor substrate; forming sidewall spacers on the side surfaces of the gate structure; forming low dose drain regions in the semiconductor substrate at two sides of the gate structure by a low dose ion implantation process using the gate structure and the sidewall spacers as a mask; forming main sidewall spacers on the surfaces of the sidewall spacers; forming trenches in the semiconductor substrate at the two sides of the gate structure by etching the semiconductor substrate using the gate structure and the main sidewall spacers as an etching mask; and filling the trenches with SiGe material; and doping the SiGe material. Thus, the SiGe source/drain regions are formed.

However, the performance of the PMOS transistors formed by the existing methods needs further improvements. For example, the carrier mobility of the channel region may need further improvements. The disclosed device structures and methods are directed to improve the performance of PMOS transistors and other problems in the art.

BRIEF SUMMARY OF THE DISCLOSURE

One aspect of the present disclosure includes a method for fabricating a PMOS transistor. The method includes providing a semiconductor substrate having a surface; forming a gate structure on the surface of the substrate; forming SiGe regions in the surface of the semiconductor substrate at two sides of the gate structure by implanting Ge ions into the semiconductor substrate; forming sidewalls on side surfaces of the gate structure and portions of surfaces of the SiGe regions close to the gate structure; removing portions of the SiGe regions at two sides of the gate structure to expose portions of the semiconductor substrate; forming trenches in the semiconductor substrate by etching the exposed portions of the semiconductor substrate at the two sides of the sidewalls; and forming source/drain regions by filling the trenches with a compressive stress material.

Another aspect of the present disclosure includes a PMOS transistor. The PMOS transistor includes a semiconductor substrate having a surface; a gate structure formed on the surface of the semiconductor substrate; sidewalls formed on the side surfaces of the gate structure and portions of the surface of the semiconductor substrate; SiGe regions formed in the portions of the surface of the semiconductor substrate under the sidewalls; source/drain regions formed in the semiconductor substrate at two sides of the sidewalls and the SiGe regions; and shallow trench isolation structures formed in the surface of the semiconductor substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

To increase the stress in the channel region of a transistor, the trenches formed by the existing methods are often sigma-shaped (Σ). That is, the trenches have protruding parts toward the portions of the semiconductor substrate under the gate structure. When SiGe material is filled in the trenches, the compressive stress applied to the channel region of the transistor by the sigma-shaped SiGe may be greater than the compressive stress applied to channel region by the SiGe with other shapes.

When the transistor is in operation, the channel region of the transistor is formed in the semiconductor substrate close to the surface of the semiconductor substrate under the gate structure. The distance between the protruding parts of the sigma-shaped trenches formed by the existing techniques and the channel region is relatively large. Thus, after filling the SiGe material into the sigma-shaped trenches, the compressive stress applied by the SiGe needs to go through a relatively long distance to reach the channel region, i.e., the region in the semiconductor substrate close to the surface substrate under the gate structure. Thus, the loss of the compressive stress may be un-avoidable; and the stress directly applied to the channel region may have a limitation.

Figure 6:
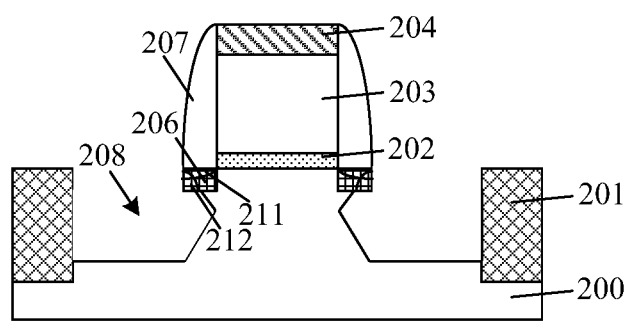
Figure 7:
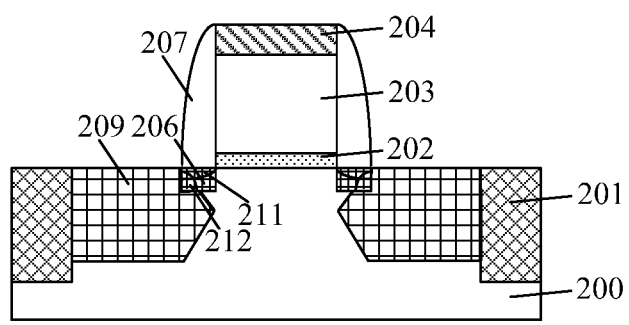
Figure 8:
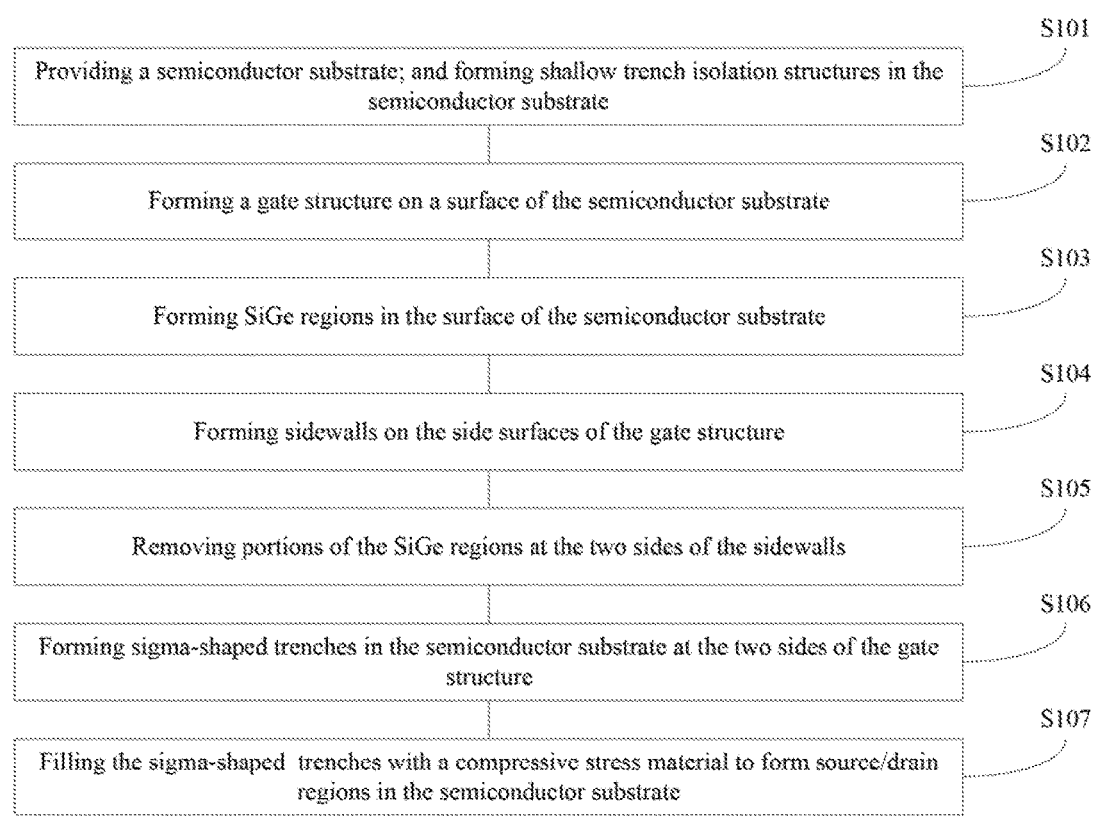
FIG. 8 illustrates an exemplary fabrication process of a PMOS transistor consistent with the disclosed embodiments.

The present disclosure provides an improved method for forming a PMOS transistor. FIG. 8 illustrates an exemplary fabrication process of a PMOS transistor consistent with the disclosed embodiments; and FIGS. 1-7 illustrate semiconductor structures corresponding to certain stages of the exemplary fabrication process.

Figure 1:
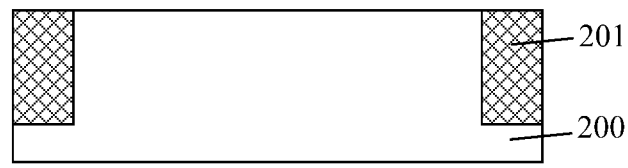
FIGS. 1-7 illustrate semiconductor structures corresponding to certain stages of an exemplary fabrication process of a PMOS transistor consistent with the disclosed embodiments.

As shown in FIG. 8, at the beginning of fabrication process, a substrate with certain structures is provided (S101). FIG. 1 illustrates a corresponding semiconductor structure.

As shown in FIG. 1, a semiconductor substrate 200 is provided. The semiconductor substrate 200 may be made of any appropriate semiconductor material, such as silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. In one embodiment, the semiconductor substrate 200 is made of silicon. The semiconductor substrate 200 provides a base for subsequent structures and processes.

Further, a plurality of shallow trench isolation (STI) structures 201 may be formed in the surface of the semiconductor substrate 200. The STI structures 201 may be used to electrically isolate adjacent active regions.

In one embodiment, the process for forming the plurality of STI structures 201 may include forming a plurality of trenches in the semiconductor substrate 200 by an etching process; forming an isolation material layer on the semiconductor substrate 200 and filling the plurality of trenches; and planarizing the isolation material layer until the surface of the semiconductor substrate 200 is exposed. Thus, the plurality of STI structures 201 may be formed.

Various processes may be used to form the isolation material layer, such as a plasma-enhanced chemical vapor deposition (PECVD) process, a low pressure chemical vapor deposition (LPCVD) process, an atmospheric pressure chemical vapor deposition (APCVD) process, a high density plasma chemical vapor deposition (HDPCVD) process, or an atomic layer deposition (ALD) process, etc. The isolation material layer may be planarized by any appropriate process, such as a chemical mechanical polishing process, etc.

In certain other embodiments, before filling the isolation material layer, a liner oxide layer may be formed on the side surfaces of the trenches and on the surface of the semiconductor substrate; and then the isolation material layer may be formed on the liner oxide layer. The liner oxide layer may be made of silicon oxide, etc. The isolation material layer may be made of silicon oxide, silicon oxynitride, or silicon oxycaribide, etc.

Further, well-regions (not shown) may be formed in the active regions (not shown). The well regions may be formed by an ion implantation process. In one embodiment, the transistor is a PMOS transistor. Thus, the doping ions for the ion implantation process may be N-type ions. The N-type doping ions may be one or more of phosphor ions, arsenic ions and antimony ions, etc.

Figure 2:
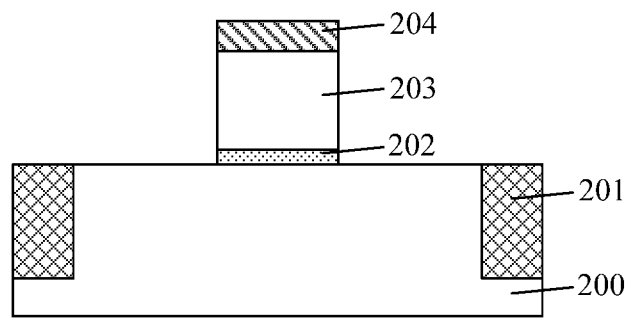

Returning to FIG. 8, after providing the semiconductor substrate 200 having the certain structures, a gate structure may be formed (S102). FIG. 2 illustrates a corresponding semiconductor structure.

As shown in FIG. 2, a gate structure (not labeled) is formed on the semiconductor substrate 200. The gate structure may include a gate dielectric layer 202 formed on the surface of the semiconductor substrate 200; and a gate electrode 203 formed on the surface of the gate dielectric layer 202.

The process for forming the gate structure may include forming a gate dielectric material layer on the surface of the semiconductor substrate 200; forming a gate electrode material layer on the gate dielectric material layer; forming a pattered hard mask layer 204 (as shown in FIG. 2) on the gate electrode material layer; and etching the gate electrode material layer and the gate dielectric material layer using the hard mask layer 204 as an etching mask. Thus, the gate dielectric layer 202 may be formed on the surface of the semiconductor substrate 200; and the gate electrode 203 may be formed on the gate dielectric layer 202.

The gate dielectric layer 202 may be made of any appropriate material, such as silicon oxide, or a high dielectric constant (high-K) material, etc. The high-K material may include $HfO_2$, $TiO_2$, $HfZrO$, $HfSiNO$, $Ta_2O_5$, $ZrO_2$, $ZrSiO_2$, $Al_2O_3$, $SrTiO_3$, and $BaSrTiO$, etc. In one embodiment, the gate dielectric layer 202 is made of silicon oxide.

The gate electrode 203 may be made of any appropriate material, such as polysilicon or metal material, etc. The metal material may include W, Al, or Cu, etc. In one embodiment, the gate electrode 203 is made of polysilicon.

After forming the gate structure, the hard mask layer 204 may be kept on the top surface of the gate structure. The hard mask layer 204 may be able to protect the top surface of the gate structure.

Figure 3:
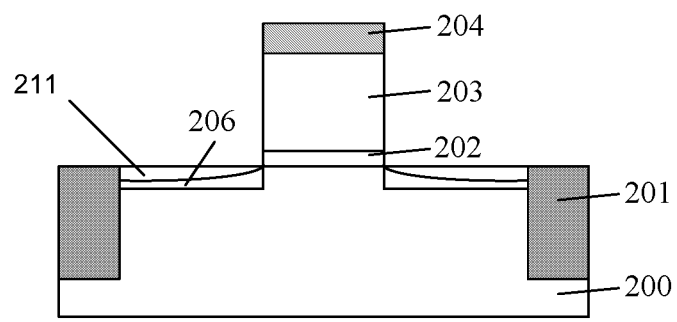

Returning to FIG. 8, after forming the gate structure, silicon germanium (SiGe) regions may be formed (S103). FIG. 3 illustrates a corresponding semiconductor structure.

As shown in FIG. 3, SiGe regions 206 are formed in the surface of the semiconductor substrate 200 at the two sides of the gate structure. The SiGe regions 206 may be formed by implanting Ge ions in the surface of the semiconductor substrate 200 at the two sides of the gate structure. The Ge ions may be implanted into the semiconductor substrate 200 by an ion implantation process.

The SiGe regions 206 may be formed in the surface of the semiconductor substrate 200. Further, one end of the SiGe region 206 may connect with the portion of the surface of the semiconductor substrate under the gate structure, i.e., the surface of the channel region of the PMOS transistor. Thus, the SiGe regions 206 may directly apply a compressive stress to the channel region of the PMOS transistor. Accordingly, the compressive stress applied on the channel region by the SiGe regions 206 may not need relatively long distances to transfer. Thus, the loss of the compressive stress may be reduced; and the SiGe regions 206 may apply a relatively large compressive stress on the channel region of the PMOS transistor.

Further, sigma-shaped trenches may be subsequently formed in the semiconductor substrate 200; and the compressive stress material may be filled into the sigma-shaped trenches to form source/drain regions. The compressive stress material may also apply a compressive stress on the channel region. Thus, the compressive stress generated by the SiGe regions 206 and the compressive stress generated by the subsequently formed source/drain regions may be added together in the channel region. Accordingly, the total compressive stress in the channel region may be relatively large; and the carrier mobility in the channel region may be increased.

In one embodiment, the energy of the ion implantation for implanting Ge ions is in a range of approximately 10 KeV-100 KeV. The angle of the ion implantation process may be in a range of 0-40°. The dosage of the ion implantation process is in a range of approximately $5E15$ atom/$cm^2$-$5E16$ atom/$cm^2$.

In one embodiment, when the Ge ions are implanted into the semiconductor substrate 200, or after implanting the Ge ions into the semiconductor substrate 200, a first low dose ion implantation process may be performed on the semiconductor substrate 200 at the two sides of the gate structure using the gate structure as a mask; and first lightly-doped drain (LDD) regions 211 may be formed. The first LDD regions may be used to prevent a hot carrier injection issue.

In certain other embodiments, after the Ge ion implantation process, sidewall spacers may be formed on the side surfaces of the gate structure. Then, the first low dose ion implantation process may be performed on the semiconductor substrate 200 at the two sides of the sidewall spacers using the gate structure and the sidewall spacers as an mask; and first LDD regions may be formed. The sidewall spacers may be used to control the positions of the LDD regions to prevent the short channel effects.

The doping type of the first LDD regions may be identical to the doping type of the subsequently formed source/drain regions. In one embodiment, the doping ions for forming the first LDD regions may be P-type doping ions. The P-type doping ions may be one or more of B ions, Ge ions and In ions, etc.

The energy of the first low dose ion implantation process for doping the P-type ions may be in a range of approximately 2 KeV-5 KeV. The dosage of the first low dose ion implantation process may be in a range of approximately $5E14$ atom/cm$^2$-$2E15$ atom/cm$^2$. The angle of the first low dose ion implantation process may be in a range of approximately 0-7°.

Figure 4:
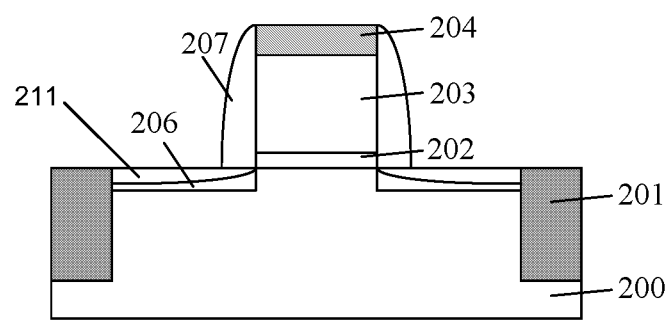

Returning to FIG. 8, after forming the SiGe regions 206, sidewalls may be formed (S104). FIG. 4 illustrates a corresponding semiconductor structure.

As shown in FIG. 4, sidewalls 207 are formed on the side surfaces of the gate structure and portions of the surfaces of the SiGe region 206. The sidewalls 207 may be used to protect the side surfaces of the gate structure during the subsequent etching processes. Further, the sidewalls 207 may also be able to control the width of the portions of the SiGe region 206 under the sidewalls 207 so as to cause the portions of the SiGe region 206 under the sidewalls 207 to apply a relatively large compressive stress to the channel region. In one embodiment, the width of the sidewalls 207 may be in a range of approximately 50 Å-200 Å. As used herein, the width of the sidewall spacers 207 refers to the width of the portion of the sidewall 207 contacting with the SiGe region 206.

The process for forming the sidewalls 207 may include forming a sidewall material layer to cover the semiconductor substrate 200, the SiGe regions 206, the side surfaces of the gate structure and the hard mask layer 204; and etching the sidewall material layer by a mask-less etching process. Thus, the sidewalls 207 may be formed on the side surfaces of the gate structure and on the surface of the portions of the SiGe regions 207 close to the gate structure.

The sidewalls 207 may be made of any appropriate material, such as one or more of silicon oxide, silicon nitride, silicon oxynitride, silicon carbonitride, and silicon carbide, etc. The sidewalls 207 may be a single layer structure, or a multiple stacked structure.

In certain other embodiments, if sidewall spacers are formed on the side surfaces of the gate structure, the sidewalls 207 may be formed on the surfaces of the sidewall spacers.

Figure 5:
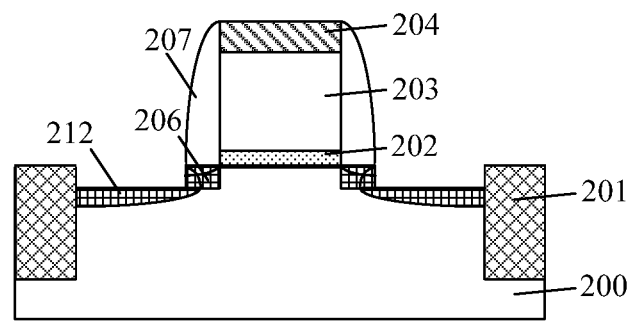

Returning to FIG. 8, after forming the sidewalls 207, portions of the SiGe regions 206 may be removed (S105). FIG. 5 illustrates a corresponding semiconductor structure.

As shown in FIG. 5, portions of the SiGe regions 206 at the two sides of the sidewalls 207 are removed; and portions of the semiconductor substrate 200 under the SiGe regions 206 may be exposed. Sigma-shaped trenches may be subsequently formed in the exposed portions of the semiconductor substrate 200. The portions of the SiGe regions 206 at the two sides of the sidewalls 207 may be removed by an etching process using the sidewalls 207 as an etching mask.

Various etching processes may be used to remove the portions of the SiGe regions 206, such as a dry etching process, or a wet etching process, etc. In one embodiment, the portions of the SiGe regions 206 are removed by a plasma etching process.

In one embodiment, after removing the portions of the SiGe regions 206 at the two sides of the sidewalls 207 to expose the portions of the semiconductor substrate 200, a second low dose ion implantation process may be performed on the portions of the semiconductor substrate 200 at the two sides of the gate structure using the side walls 207 and the remaining SiGe regions 206 as an etching mask; and second LDD regions 212 may be formed in the semiconductor substrate 200 at the two sides of the sidewalls 207 and the remaining SiGe regions 206. The depth of the second LDD regions may be greater than the depth of the first LDD regions. Further, the vertical distance between the second LDD region and the edge of the gate structure may be greater than the distance between the first LDD region and the edge of the gate structure. Such a structure may cause the electric potential between the gate structure and the subsequently formed source/drain regions to have a gradient distribution. Thus, the generation of the hot carrier injection may be further prevented.

In one embodiment, the ions of the second low dose ion implantation process are P-type doping ions. The energy of the second low dose ion implantation process with P-type ions may be in a range of approximately 2 KeV-5 KeV. The dosage of the second low dose ion implantation process may be in a range of approximately $1E14$ atom/cm$^2$-$5E14$ atom/cm$^2$. The angle of the second ion implantation process may be in a range of approximately 15°-30°.

In certain other embodiments, in addition to the P-type doping ions, the ions of the second low dose ion implantation process may also include one or more of C ions, N ions and F ions, etc. The C ions, N ions and F ions, etc. may be used to prevent an excessive diffusion of the doping ions implanted by the first low dose ion implantation process and the second low dose ion implantation process to the channel region during a subsequent thermal annealing process. Thus, the short channel effect may be prevented.

The energy of the second low dose ion implantation process when the ions are one of C ions, N ions and F ions, etc. may be in a range of approximately 0.5 KeV-20 KeV. An angle of the second low dose ion implantation process may be in a range of approximately 0-40°. The dosage of the second low dose ion implantation process may be in a range of approximately $1E14$ atom/cm$^2$-$1E15$ atom/cm$^2$. Such an energy range and dosage range may be able to implant the C ions, the N ions or the F ions into the portions of the remaining SiGe regions 206 under the sidewalls 207. Further, the energy range and the dosage range may also be able to prevent the doping ions implanted into the portions of the SiGe regions 206 under the sidewalls 207 from diffusing into the channel region with a relatively large speed. C ions, N ions or F ions may combine with the defects in the semiconductor substrate 200 to form defect clusters that are difficult to separate. Further, the existence of the C ions, N ions or F ions may form the defect cluster regions. Thus, the defect-assisted doping ions-enhanced diffusion may be reduced.

After forming the second LDD regions, a first thermal annealing process may be performed. The first thermal annealing process may cause the doping ions in the first LDD regions and the second LDD regions to diffuse. During the subsequent etching process for forming trenches in the semiconductor substrate, the remaining SiGe regions 206 under the sidewalls 207 may still have the first LDD regions and the second LDD regions. The depth of the second LDD regions may be greater than the depth of the first LDD regions; and the vertical distance between the second LDD region and the edge of the gate structure may be greater than the vertical distance between the first LDD region and the edge of the gate structure.

Returning to FIG. 8, after forming the first thermal annealing process, sigma-shaped trenches may be formed (S106). FIG. 6 illustrates a corresponding semiconductor structure.

As shown in FIG. 6, sigma-shaped trenches 208 are formed in the semiconductor substrate 200 at the two sides of the sidewalls 207 and the remaining SiGe regions 206 under the sidewalls 207. The sigma-shaped trenches 208 may be formed by etching the portions of the semiconductor substrate 200 at the two sides of sidewalls 207 and the remaining SiGe regions 206 under the sidewalls 207 using the sidewalls 207 and the remaining SiGe regions 206 under the sidewalls 207 as an etching mask.

Specifically, the process for forming the sigma-shaped trenches 208 may include etching the portions of the semiconductor substrate 200 at the two sides of sidewalls 207 and the remaining SiGe regions 206 under the sidewalls 207 using the sidewalls 207 and the remaining SiGe regions 206 under the sidewalls 207 as an etching mask by an dry etching process to form rectangular trenches; and followed by etching the rectangular trenches by an wet etching process. Thus, the sigma-shaped trenches 208 may be formed.

In one embodiment, the etching gases of the dry etching process may include $CF_4$, HBr, He and $O_2$, etc. The flow rate of $CF_4$ may be in a range of approximately 20 sccm-200 sccm. The flow rate of HBr may be in range of approximately 50 sccm-1000 sccm. The flow rate of He may be in a range of approximately 200 sccm-1000 sccm. The flow rate of $O_2$ may be in a range of approximately 5 sccm-20 sccm. The temperature of the reaction chamber may be in a range of approximately 40° C.-80'C. The pressure of the reaction chamber may be in a range of approximately 5 mTorr-50 mTorr. The radio frequency power may be in a range of approximately 400 W-750 W. The bias power may be in a range of approximately 0-100 W. The time for the dry etching process may be in a range of approximately 20 s-80 s.

The etching solution of the wet etching process may be include tetramethylammonium hydroxide (TMAH), or $NH_3.H_2O$, etc. The mass concentration of TMAH or $NH_3.H_2O$ in the etching solution may be in a range of approximately 1%-5%. The etching time of the wet etching process may be in a range of approximately 20 s-80 s.

These parameters of the dry etching process and the wet etching process may form the sigma-shaped trenches 208 with desired quality. Further, the damages to the remaining SiGe regions 206 under the sidewalls 207 may be reduced.

Returning to FIG. 8, after forming the sigma-shaped trenches 208, source/drain regions may be formed (S107). FIG. 7 illustrates a corresponding semiconductor structure.

As shown in FIG. 7, a compressive stress material is filled into the sigma-shaped trenches 208; and the source/drain regions 209 are formed. The compressive stress material may provide a compressive stress to the channel region of the PMOS transistor.

The compressive stress material may be any appropriate material. In one embodiment, the compressive stress material is SiGe or SiGeSn.

When the compressive stress material is SiGe, the concentration of Ge atoms in the compressive stress material may be in a range of approximately 20%-50%. Such a concentration range may cause the compressive stress material to be able to apply a relatively large compressive stress to the channel region of the PMOS transistor.

When the compressive stress material is SiGeSn, the concentration of Ge atoms in the compressive stress material may be in a range of approximately 20%-50%; and the concentration of Sn atoms in the compressive stress material may be in a range of approximately 1%-5%. Such concentration ranges may increase the compressive stress applied on the channel region of the PMOS transistor.

The compressive stress material may be filled into the sigma-shaped trenches 208 by any appropriate process. In one embodiment, a selective epitaxial growth process is used to fill the compressive stress material into the sigma-shaped trenches 208.

The compressive stress material may be doped with P-type doping ions. The P-type doping ions may be one or more of B ions, Ge ions and In ions, etc.

Various processes may be used to dope the compressive stress material. In one embodiment, a self-doping process or an ion implantation process is used to dope the compressive stress material.

When the compressive stress material is SiGe, in one embodiment, the temperature of the reaction chamber of the selective epitaxial growth process may be in a range of approximately 600° C.-1100° C. The pressure of the reaction chamber may be in a range of approximately 1 Torr-500 Torr. The silicon source gas may be $SiH_4$, or DCS, etc. The flow rate of the silicon source gas may be in a range of approximately 30 sccm-500 sccm. The germanium source gas may be $GeH_4$, etc. The flow rate of the germanium source gas may be in a range of approximately 5 sccm-400 sccm. The precursor gases of the selective epitaxial growth process may also include HCl gas, and $H_2$, etc. $H_2$ may be used as a carrier gas. The HCl gas may be used as a selective gas; and may be used to increase the selectivity of the deposition process. The selective gas may also be $Cl_2$. The flow rate of HCl gas may be in a range of approximately 50 sccm-200 sccm. The flow rate of $H_2$ may be in a range of approximately 0.1 slm-50 slm. Such parameters may reduce the defects in the compressive stress material. Further, the stacking faults between the compressive stress material and the remaining SiGe regions 206 under the sidewalls 207 may be reduced. Thus, the source/drain regions 209 and the remaining SiGe regions 206 under the sidewalls 207 may be able to apply a relatively large stress on the channel region of the PMOS transistor.

When the self-doping process is used to dope the compressive stress material, a doping source gas may be introduced into the reaction chamber of the selective epitaxial growth process. In one embodiment, the doping source gas may be $PH_3$ or $AsH_3$.

When the compressive stress material is SiGeSn, in one embodiment, the temperature of the reaction chamber of the selective epitaxial growth process may be in a range of approximately 600° C.-1100° C. The pressure of the reaction chamber may be in a range of approximately 1 Torr-500 Torr. The silicon source gas may be $SiH_4$, or $H_2SiCl_2$ (DCS), etc. The flow rate of the silicon source gas may be in a range of approximately 30 sccm-500 sccm. The germanium source gas may be $GeH_4$, etc. The flow rate of the germanium source gas may be in a range of approximately 5 sccm-400 sccm. The Sn source gas may be $SnCl_4$. The flow rate of the Sn source gas may be in a range of approximately 1 sccm-300 sccm. The precursor gases of the selective epitaxial growth process may also include HCl gas, and $H_2$, etc. $H_2$ may be used as a carrier gas. The HCl gas may be used as a selective gas; and may be used to increase the selectivity of the deposition process. The selective gas may also be $Cl_2$. The flow rate of HCl gas may be in range of approximately 50 sccm-200 sccm. The flow rate of $H_2$ may be in a range of approximately 0.1 slm-50 slm. Such parameters may reduce the defects in the compressive pressure material. Further, the stacking faults between the compressive stress material and the remaining SiGe regions 206 under the sidewalls 207 may be reduced. Thus, the source/drain regions 209 and the remaining SiGe regions 206 under sidewalls 207 may be able to apply a relatively large stress on the channel region of the of the PMOS transistor.

Thus, a PMOS transistor may be formed by the disclosed methods and processes. The corresponding PMOS transistor is illustrated in FIG. 7.

As shown in FIG. 7, the PMOS transistor includes a semiconductor substrate 200; and a gate structure (not labeled) formed on a surface of the semiconductor substrate 200. The gate structure may include a gate dielectric layer 202 formed on a surface of the semiconductor substrate 200 and a gate electrode 203 formed on the surface of the gate dielectric layer 202. The PMOS transistor may also include sidewalls 207 formed on the side surfaces of the gate structure and portions of the surface of the semiconductor substrate 200; and SiGe regions 206 formed in the portions of the surface of the semiconductor substrate 200 under the sidewalls 207. Further, the PMOS transistor may also include source/drain regions 209 formed in the semiconductor substrate 200 at two sides of the sidewalls 207 and the SiGe regions 206. Further, the PMOS transistor may also include shallow trench isolation structures 201 formed in the surface of the semiconductor substrate 200. The detailed structures and intermediate structures are described above with respect to the fabrication processes.

Thus, according to the disclose processes and structures, before forming the source/drain regions, SiGe regions may be formed in the semiconductor substrate at two sides of the gate structure by a Ge ion implantation process using the gate structure as a mask. One end of the SiGe region may contact with the region of the semiconductor substrate under the gate structure, i.e., the channel region of the PMOS transistor when the PMOS transistor is in operation. Thus, the compressive stress applied on the channel region by the SiGe regions may not need a long transfer distance; and the loss of the compressive stress may be reduced. Accordingly, a relatively large compressive stress may be applied on the channel region by the SiGe regions.

Further, after forming the SiGe regions, sigma-shaped trenches may be formed in the semiconductor substrate; and a compressive stress material may be filled in the sigma-shaped trenches to form source/drain regions. The filled compressive stress material may also be able to apply a compressive stress on the channel region. The stress applied by the SiGe regions and the stress applied by the compressive stress material may be added to generate a larger compressive stress on the channel region. The carrier mobility of the channel region may be increased; and the performance of the PMOS transistor may be improved.

Further, the formation of the SiGe regions may prevent the electric field penetration between the source region and the drain region of a PMOS transistor through a charge transfer. Thus, the device drain-induced-barrier-lowering (DIBL), i.e., a short channel effect, and the carrier mobility may be improved.

Further, the disclosed device structure may also be able to prevent the lateral diffusion of between the source region and the drain region of a PMOS transistor from forming an intrinsic channel in the channel region of the PMOS transistor. Thus, the performance of the PMOS transistor may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a PMOS transistor, comprising:
   providing a semiconductor substrate having a surface;
   forming a gate structure on the surface of the semiconductor substrate;
   forming SiGe regions in the surface of the semiconductor substrate at two sides of the gate structure by implanting Ge ions into the semiconductor substrate;
   forming sidewall spacers on side surfaces of the gate structure and portions of surfaces of the SiGe regions close to the gate structure;
   after forming the SiGe regions, forming first low dose drain (LDD) regions in the semiconductor substrate at two sides of the sidewall spacers by a first low dose ion implantation process;
   removing portions of the SiGe regions at the two sides of the gate structure to expose portions of the semiconductor substrate;
   after removing the portions of the SiGe regions, forming second low dose drain (LDD) regions in the semiconductor substrate at the two sides of the sidewall spacers and remaining SiGe regions by a second low dose ion implantation process, wherein
   a depth of the second low dose drain (LDD) regions is greater than a depth of the first low dose drain (LDD) regions,
   a distance between the second low dose drain (LDD) region and an edge of the gate structure is greater than a distance between the first low dose drain (LDD) region and the edge of the gate structure, and
   the doping ions in the first low dose drain (LDD) regions and the second low dose drain (LDD) regions are P-type doping ions;
   forming trenches in the semiconductor substrate by etching the exposed portions of the semiconductor substrate at the two sides of the sidewall spacers; and
   forming source/drain regions by filling the trenches with a compressive stress material, wherein:
   an energy of the first low dose ion implantation process for implanting the P-type doping ions is in a range of approximately 2 KeV-5 KeV;

a dosage of the first low dose ion implantation process for implanting the P-type doping ions is in a range of approximately 5E14 atom/cm$^2$-2E15 atom/cm$^2$;
an angle of the first low dose ion implantation process is in a range of approximately 0-7°;
an energy of the second low dose ion implantation process for implanting the P-type doping ions is in a range of approximately 2 KeV-5 KeV;
a dosage of the second low dose ion implantation process for implanting the P-type doping ions is in a range of approximately 1E14 atom/cm$^2$-5E14 atom/cm$^2$; and
an angle of the second low dose ion implantation process is in a range of approximately 15°-30°.

2. The method according to claim 1, wherein the doping ions of the second low dose ion implantation process further comprises:
one of C ions, N ions and F ions.

3. The method according to claim 1, wherein forming the trenches further comprises:
forming rectangular-shaped trenches in the semiconductor substrate at the two sides of the sidewall spacers and the remaining SiGe regions by etching the semiconductor substrate using the sidewall spacers and the remaining SiGe regions as an etching mask by a dry etching process; and
etching the rectangular-shaped trenches by a wet etching process to form sigma-shaped trenches.

4. The method according to claim 3, wherein:
etching gases of the dry etching process include CF$_4$, HBr, He, and O$_2$;
a flow rate of CF$_4$ is in a range of approximately 20 sccm-200 sccm;
a flow rate of HBr is in a range of approximately 50 sccm-1000 sccm;
a flow rate of O$_2$ is in a range of approximately 5 sccm-20 sccm;
a temperature of a reaction chamber of the dry etching process is in a range of approximately 40° C.–80° C.;
a pressure of the reaction chamber is in a range of approximately 5 mTorr-50 mTorr;
a radio frequency power of the dry etching process is in a range of approximately 400 W-750 W;
a bias power of the dry etching process is in a range of approximately 0-100 W; and
an etching time of the dry etching process is in a range of approximately 20 s-80 s.

5. The method according to claim 3, wherein:
an etching solution of the wet etching process includes one of TMAH solution and NH$_3$.H$_2$O solution;
a mass percentile of TMAH or NH$_3$.H$_2$O in the etching solution is in a range of approximately 1%-5%; and
an etching time of the wet etching process is in a range of approximately 20 s-80 s.

6. The method according to claim 1, wherein forming the trenches further comprises:
forming rectangular-shaped trenches in the semiconductor substrate at the two sides of the sidewall spacers and the remaining SiGe regions by etching the semiconductor substrate using the sidewall spacers and the remaining SiGe regions as an etching mask by a dry etching process; and
etching the rectangular-shaped trenches by a wet etching process to form sigma-shaped trenches.

7. The method according to claim 6, wherein:
etching gases of the dry etching process include CF$_4$, HBr, He, and O$_2$;
a flow rate of CF$_4$ is in a range of approximately 20 sccm-200 sccm;
a flow rate of HBr is in a range of approximately 50 sccm-1000 sccm;
a flow rate of O$_2$ is in a range of approximately 5 sccm-20 sccm;
a temperature of a reaction chamber of the dry etching process is in a range of approximately 40° C.–80° C.;
a pressure of the reaction chamber is in a range of approximately 5 mTorr-50 mTorr;
a radio frequency power of the dry etching process is in a range of approximately 400 W-750 W;
a bias power of the dry etching process is in a range of approximately 0-100 W; and
an etching time of the dry etching process is in a range of approximately 20 s-80 s.

8. The method according to claim 6, wherein:
an etching solution of the wet etching process includes one of TMAH solution and NH$_3$.H$_2$O solution;
a mass percentile of TMAH or NH$_3$.H$_2$O in the etching solution is in a range of approximately 1%-5%; and
an etching time of the wet etching process is in a range of approximately 20 s-80 s.

9. A method for fabricating a PMOS transistor, comprising:
providing a semiconductor substrate having a surface;
forming a gate structure on the surface of the semiconductor substrate;
forming SiGe regions in the surface of the semiconductor substrate at two sides of the gate structure by implanting Ge ions into the semiconductor substrate;
forming sidewall spacers on side surfaces of the gate structure and portions of surfaces of the SiGe regions close to the gate structure;
after forming the SiGe regions, forming first low dose drain (LDD) regions in the semiconductor substrate at two sides of the sidewall spacers by a first low dose ion implantation process;
removing portions of the SiGe regions at the two sides of the gate structure to expose portions of the semiconductor substrate;
after removing the portions of the SiGe regions, forming second low dose drain (LDD) regions in the semiconductor substrate at the two sides of the sidewall spacers and remaining SiGe regions by a second low dose ion implantation process, wherein
a depth of the second low dose drain (LDD) regions is greater than a depth of the first low dose drain (LDD) regions,
a distance between the second low dose drain (LDD) region and an edge of the gate structure is greater than a distance between the first low dose drain (LDD) region and the edge of the gate structure, and
the doping ions in the first low dose drain (LDD) regions and the second low dose drain (LDD) regions are P-type doping ions;
forming trenches in the semiconductor substrate by etching the exposed portions of the semiconductor substrate at the two sides of the sidewall spacers; and
forming source/drain regions by filling the trenches with a compressive stress material, wherein:
an energy of the second low dose ion implantation process is in a range of approximately 0.5 KeV-20 KeV;
a dosage of the second low dose ion implantation process is in a range of approximately 1E14 atom/cm$^2$-1E15 atom/cm$^2$; and an angle of the second low dose ion implantation process is in a range of approximately 0°-10°.

10. The method according to claim 9, wherein:
the Ge ions are implanted into the semiconductor substrate by an ion implantation process after forming the gate structure.

11. The method according to claim 10, wherein
an energy of the ion implantation process of the Ge ions is in a range of approximately 10 KeV-100 KeV;
an angle of the ion implantation process of the Ge ions is in a range of approximately 0-40°; and
a dosage of the Ge ions is in range of approximately 5E15 atom/cm$^2$-5E16 atom/cm$^2$.

12. The method according to claim 9, after the second low dose ion implantation process, further comprising:
performing a thermal annealing process to cause the doping ions in the first low dose drain (LDD) regions and the second low dose drain (LDD) regions to diffuse.

* * * * *